United States Patent [19]

Pfiester

[11] Patent Number: 4,997,785
[45] Date of Patent: Mar. 5, 1991

[54] SHARED GATE CMOS TRANSISTOR

[75] Inventor: James R. Pfiester, Austin, Tex.

[73] Assignee: Motorola, Inc., Schaumburg, Ill.

[21] Appl. No.: 402,291

[22] Filed: Sep. 5, 1989

[51] Int. Cl.$^5$ ............................................. H01L 21/72
[52] U.S. Cl. ...................................... 437/57; 437/34; 437/913; 437/915
[58] Field of Search ...................... 437/57, 913, 915; 148/DIG. 82, DIG. 164, 34

[56] References Cited

U.S. PATENT DOCUMENTS

| | | | |
|---|---|---|---|
| 4,467,518 | 8/1984 | Bansal et al. | 437/915 |
| 4,637,128 | 1/1987 | Mizutani | 148/DIG. 82 |
| 4,642,880 | 2/1987 | Mizutani et al. | 437/913 |
| 4,651,408 | 3/1987 | MacElwee et al. | 437/913 |
| 4,876,213 | 10/1989 | Pfiester | 437/57 |
| 4,918,510 | 4/1990 | Pfiester | 357/41 |

OTHER PUBLICATIONS

J. H. Douglass, "The Route to 3-D Chips," High Technology, Sep. 1983, pp. 55-59.

*Primary Examiner*—Brian E. Hearn
*Assistant Examiner*—Linda J. Fleck
*Attorney, Agent, or Firm*—Jasper W. Dockrey

[57] ABSTRACT

A stacked shared-gate CMOS transistor and method of fabrication are disclosed. An improved CMOS transistor is fabricated by the formation of a bulk transistor and an overlying isolated (SOI) transistor wherein each transistor is adjoined to a portion of a shared gate having the same conductivity type as the related transistor. The differential conductivity of the shared gate is obtained by the fabrication of a conductive diffusion-barrier layer intermediate to conductive layers. Improved switching performance is obtained as a result of higher current levels produced by the isolated transistor.

11 Claims, 3 Drawing Sheets

SHARED GATE CMOS TRANSISTOR

BACKGROUND OF THE INVENTION

This invention relates in general to semiconductor devices and more specifically to vertically oriented CMOS transistors having an isolated transistor overlying a bulk transistor.

In the design and fabrication of a memory component such as an SRAM cell it has been demonstrated that a CMOS transistor configuration operates with less quiescent power dissipation than for example, a cell using a polysilicon load resistor. A P-channel transistor, in the off state, can easily yield a resistance value three orders of magnitude greater than a polysilicon load resistor of suitable size for a VLSI-SRAM cell. Recently, vertically-oriented CMOS transistors have been developed that place the P-channel transistor in an overlying polysilicon layer. A vertical or stacked configuration offers the potential advantage of low power dissipation and high packing density. In a stacked configuration, the N-channel transistor and the P-channel transistor can use the same portion of a polysilicon lead as a gate electrode. This is known in the art as a shared gate. Each transistor channel is adjoined to a single portion of a polysilicon lead which results in a reduction in the amount of polysilicon required to form the CMOS gate and a further increase the packing density. Typically the source and drain of the N-channel transistor are formed in a bulk silicon substrate and the P-channel transistor is formed in an overlying layer of polysilicon which is electrically isolated from the substrate by an intermediate dielectric layer. Both the N-channel or bulk transistor and the P-channel or isolated transistor are switched on and off by applying a potential to the shared gate.

One problem associated with using an electrically isolated P-channel transistor in a shared gate configuration is the poor gain and switching performance generally obtained from the electrically isolated P-channel transistor. Obtaining optimum dynamic performance from the P-channel transistor requires critical attention to interface charge states facing the channel because of the inherent low charge carrier mobility in a semi-amorphous material such as polysilicon. The low carrier mobility increases the threshold voltage creating a need for more applied voltage to deplete the channel region. Also, because the P-channel transistor elements located in the overlying polysilicon layer are electrically isolated from the substrate, a convenient means of reverse biasing the source and drain junctions and the channel region is not available. The floating potential of the channel region causes variations in the threshold voltage of the isolated transistor and a reduction of the transconductance when the channel is saturated. Given the required switching speed, a sufficient voltage to invert the channel may not be applied in time to meet the switching requirement. This results in a low drive current in the CMOS transistor.

SRAM cells must store data in the form of a voltage difference and provide such difference across a bit line pair. The ability to rapidly establish the voltage difference on a bit line pair is dependent upon available drive current within the cell. The fabrication of an SRAM cell incorporating stacked CMOS transistor architecture has successfully reduced the SRAM cell area, however, these cells have also exhibited poor performance. SRAM cells using stacked shared gate P-channel load devices exhibit soft bit failure as a result of the P-channel not supplying sufficient current when the CMOS transistor is turned on. Accordingly, a need existed for a stacked shared gate CMOS transistor having an isolated transistor with improved gain and switching performance.

BRIEF SUMMARY OF THE INVENTION

An object of the present invention is to provide an improved CMOS transistor structure.

Another object of the present invention is to provide an improved method for the fabrication of a stacked-shared-gate CMOS transistor.

Yet another object of the present invention is to provide an improved CMOS SRAM cell.

These and other objects of the invention are achieved through the fabrication of a stacked shared-gate CMOS transistor having an isolated transistor with a reduced threshold voltage level. In accordance with one embodiment of the invention, a silicon substrate is provided having an active region in which to form a transistor and having a dielectric layer formed thereon. A first conductive layer of a first conductivity type is formed to overlie the dielectric layer and a barrier layer is formed to overlie the first conductive layer. The barrier layer is an electrically conductive material that resists dopant out diffusion from the first conductive layer. A second conductive layer of a second conductivity type is formed to overlie the barrier layer and an etch mask is formed on the second conductive layer. Anisotropic etching is performed to etch the second conductive layer, the barrier layer, and the first conductive layer to form a differentially doped shared gate structure. The etch mask is removed and heavily-doped regions of a first conductivity type are formed in the substrate on either side of the shared gate using the shared gate as a dopant mask. The shared gate and the heavily-doped regions comprise the gate electrode and the source/drain regions respectively of a bulk transistor. An insulation layer is formed to overlie the shared gate and the remaining substrate. A third conductive layer of a second conductivity type is formed to overlie the insulation layer. Highly doped portions of a second conductivity type are formed in the third conductive layer on either side of the shared gate. The highly doped portions of the third conductive layer and the shared gate form the source/drain regions and the gate electrode respectively of an isolated transistor. The bulk transistor and the isolated transistor comprises the transistors of opposite conductivity of a stacked CMOS transistor wherein each transistor channel region is of the same conductivity type as the overlying gate electrode.

DETAILED DESCRIPTION OF THE PREFERRED EMBODIMENTS

Figure 1:
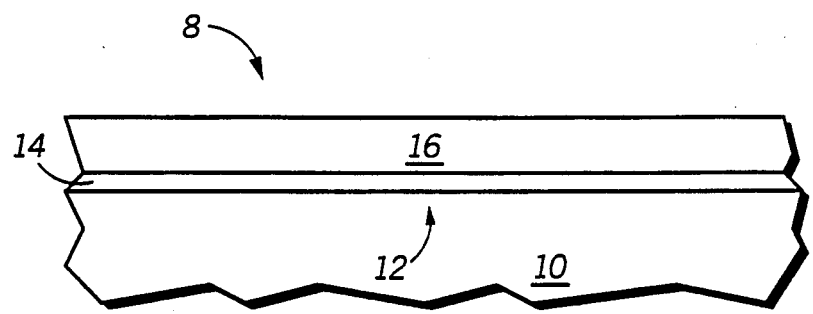
FIGS. 1 through 7 illustrate, in cross section, process steps in accordance with one embodiment of the invention.

Shown in FIG. 1, in cross section, is a portion 8 of a semiconductor composite structure comprising a P-type, monocrystalline silicon substrate 10 doped with an acceptor atom such as boron to yield a resistivity of about 1 ohm-cm. A channel region 12 is formed in substrate 10 by ion implantation of boron ions to obtain a desired threshold voltage in a manner well known in the prior art. A thin dielectric layer 14 having a thickness of about 10 to 20 nanometers is formed to overlie substrate 10 and separates substrate 10 from a N-type conductive layer 16. Conductive layer 16 is doped to a sheet resistance of about 40 ohms per square with a donor atom such as phosphorus. Conductive layer 16 will be used to form the N-doped side of the shared gate and may be fabricated from, for example, a deposited layer of polysilicon which is subsequently doped with phosphors at an elevated temperature. Alternatively, conductive layer 16 may be formed from the deposition of a layer of a refractory metal silicide such as tungsten silicide, titanium silicide, cobalt silicide of the like.

Figure 2:
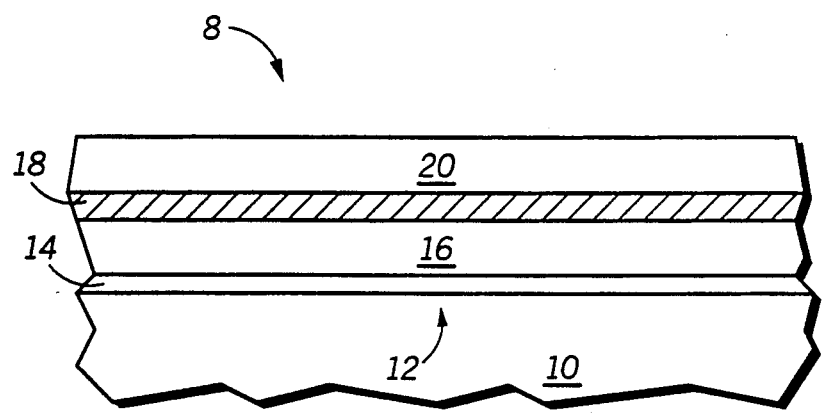

After layer 16 is formed, a diffusion barrier layer 18 is formed to overlie conductive layer 16 as shown in FIG. 2. Barrier layer 18 is formed from a conductive material such as titanium nitride or titanium carbide that will prohibit dopant out-diffusion from layer 16. The deposition of barrier layer 18 effectively seals the top surface of conductive layer 16 and prevents conductive layer 16 from acting as a dopant source to any overlying layers during subsequent high temperature processing. In one embodiment, the barrier layer if formed by the chemical vapor deposition of titanium nitride, tantalum nitride, chromium nitride, or the like to a thickness of about 20 to 25 nanometers. Alternatively, barrier layer 18 is formed by depositing a layer of titanium, by chemical vapor deposition or other means, directly onto conductive layer 16, then annealing in a nitrogen atmosphere at a temperature of about 650 to 700 degrees centigrade for about 2 minutes. The nitrogen anneal forms a layer of titanium nitride having a thickness of about 20 nanometers. During the nitrogen anneal titanium also reacts with the silicon in conductive layer 16 to form titanium silicide. In another alternative, titanium nitride, tantalum nitride, or the like is sputtered from a suitable target material forming a refractory-metal nitride layer on conductive layer 16. In yet another alternative, the barrier layer is formed by sputtering titanium carbide onto conductive layer 16.

The inventive process continues with the formation of a second conductive layer 20, which is deposited to a thickness of about 100 to 200 nanometers and doped with a P-type acceptor atom such as boron. The boron doping of conductive layer 16 produces a sheet resistance of about 100 ohms per square. The presence of barrier layer 18 prevents the diffusion of phosphorus from first conductive layer 16 into the boron doped second conductive layer 20. The out diffusion of phosphorus from first conductive layer 16 would normally occur during the heat cycles required to introduce and distribute the boron in second conductive layer 20. Alternatively, when the first conductive layer is polysilicon, second conductive layer 20 may be formed from the deposition of a refractory metal silicide such as tungsten silicide, titanium silicide, cobalt silicide or the like.

Figure 3:
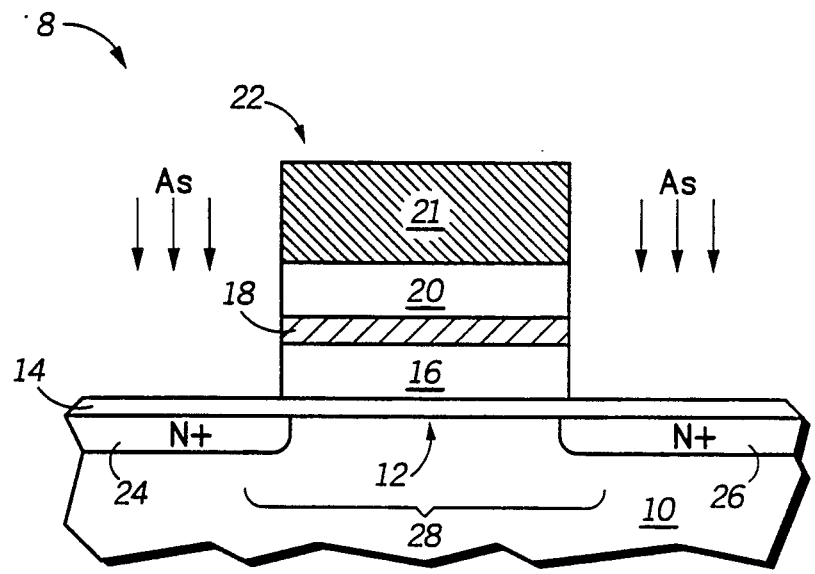

Referring to FIG. 3, the combined structure comprising the P-type second conductive layer 20, the barrier layer 18, and the N-type first conductive layer 16 is patterned using conventional photolithography techniques and anisotropically etched to form a shared transistor gate 22. An anisotropic etch is an etch that proceeds in the vertical direction much faster than in the horizontal direction, thus tending to produce a structure with near vertical edges. Thus a shared gate has been formed having layers with different conductivity separated by a conductive diffusion barrier. The formation of a differentially doped gate, having both a P-type region and an N-type region, permits the independent adjustment of the gate conductive properties for each transistor which is to share the common gate electrode.

After formation of the shared gate, an N-type source region 24 and drain region 26, also labeled as N+, are formed in substrate 10 by ion implantation of a donor ion such as arsenic using the shared gate 22 as an implant mask. The source and drain region are self-aligned to the shared gate as shown in FIG. 3. Shared gate 22 overlies channel region 12 which is now bounded by the source and drain regions thus forming an N-channel transistor 28.

Figure 4:
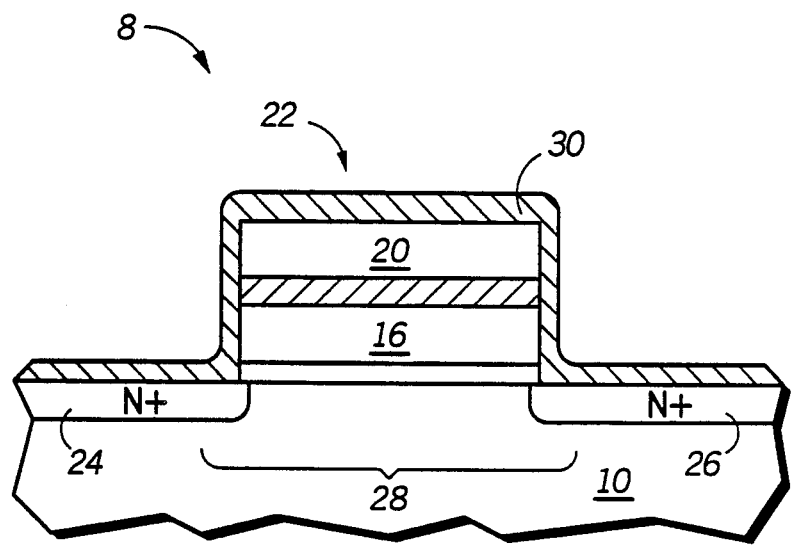

Following the formation of N-channel transistor 28 an insulation layer 30 is formed to overlie shared gate 22 and remaining portions of substrate 10 as illustrated in FIG. 4. Insulation layer 30 is formed by the thermal oxidation of substrate 10. Alternatively, insulation layer 30 is conformably deposited by chemical vapor deposition of a dielectric material such as silicon dioxide. In another alternative, insulation layer 30 is formed by the thermal oxidation of substrate 10 followed by the deposition of a silicon nitride layer which is in turn followed by the deposition of a silicon dioxide layer, thus producing a composite oxide-nitride-oxide (ONO) layer. An ONO composite layer is well known to the art as a dielectric material having electrical insulation properties. Insulation layer 30 will be used to form the gate dielectric and isolation layer for a P-channel transistor to be formed overlying N-channel transistor 28.

Figure 5:
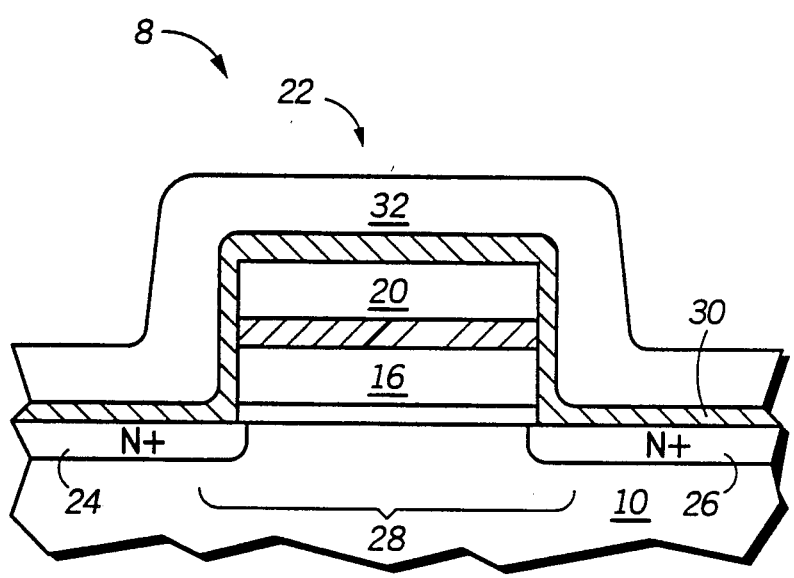

In accordance with the invention, a P-type doped polysilicon layer 32, having been doped for example with boron, is deposited to a thickness of about 100 to 300 nanometers on the surface of insulation layer 30 as shown in FIG. 5. P-type polysilicon layer 32 will e used to form the source and drain and conductive channel elements of a P-channel transistor overlying N-channel transistor 28.

Figure 6:
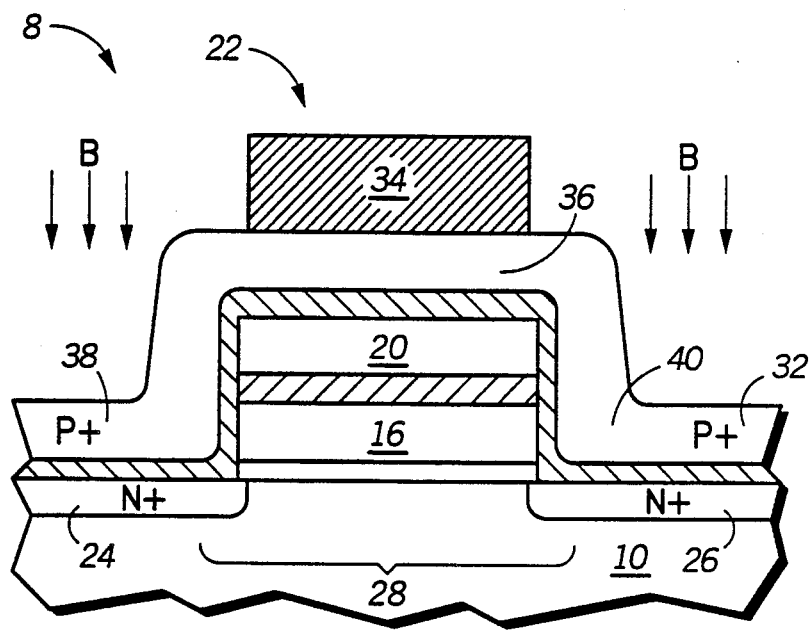

Following the deposition of polysilicon layer 32 a channel region 36 is produced in layer 32 by forming a photoresist mask 34 on polysilicon layer 32 and located over a central portion of shared gate 22 as shown in FIG. 6. Heavily doped P+ regions 38 and 40, also labeled as P+, are formed in polysilicon layer 32 by ion implantation of boron or other means using mask 34 as a dopant mask. Mask 24 protects the channel region from contact with the dopant atoms used to form the the heavily doped P+ regions.

Figure 7:
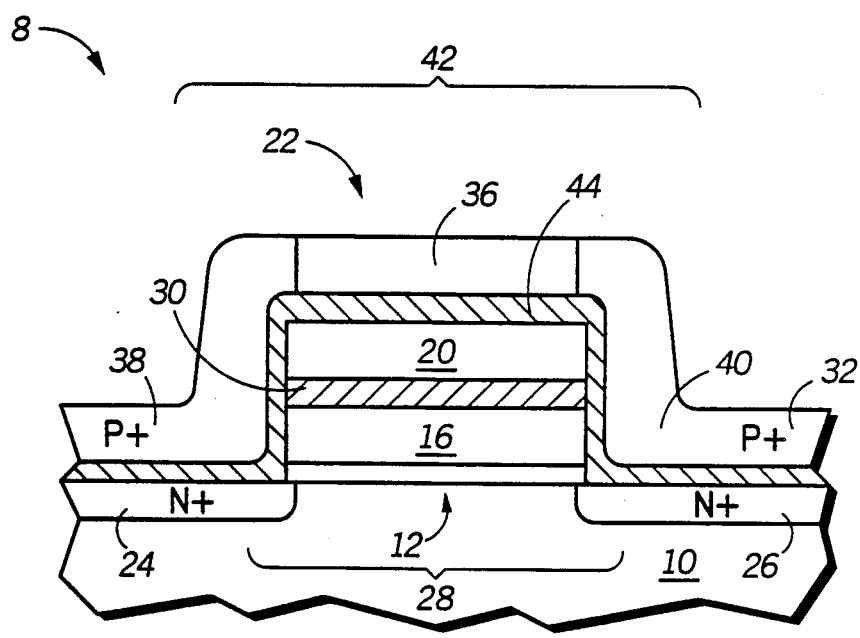

The stacked CMOS transistor is then finished by removal of mask 34 as illustrated in FIG. 7. The heavily doped regions 38 and 40 comprise the source and drain respectively of an isolated P-channel transistor 42. The channel region 36 is charge controlled by shared gate 22. The P-channel transistor 42 is electrically isolated from the N-channel transistor 28 by insulation layer 30. A portion 44 of insulation layer 30 underlying channel region 36 functions as the gate dielectric for transistor 42.

The structure illustrated in FIG. 7, in accordance with the invention, has the advantage of having the isolated transistor gate doped to have the same conductivity type as the source and drain region at the gate/channel interface. An important factor that contributes to the magnitude of the threshold voltage in a transistor is the work function which represents the energy required to move a charge across the energy barrier from the gate electrode to the channel. The work function is determined by the difference between the Fermi energy level of the gate electrode and that of the channel material. The magnitude of the work function potential is influenced by the relative conductivity of the dopant introduced to the gate and the channel material. For example, relative to an intrinsic energy level, introducing a donor atom increases the Fermi energy level above that of the intrinsic energy level, conversely, introducing an acceptor atom decreases the Fermi energy level relative to the intrinsic energy level. For a polysilicon gate electrode the intrinsic energy level is the same in the gate as the channel because both are silicon.

Considering the effect of doping conductivity upon the work function, it becomes clear that a the work function, and hence the magnitude of the threshold voltage, will be greater when the gate electrode and the channel have opposite conductivity. The equivalent conductivity of the gate and the channel, as provided by the present invention, reduces work function potential thus lowering the threshold voltage of the P-channel transistor by about 1 volt relative to that obtained by the prior art process of fabricating the shared gate singly from N-type polysilicon. The reduced threshold voltage magnitude allows the isolated transistor to be turned on rapidly and effectively bring the channel to saturation. Bringing the transistor to saturation produces a high current through the transistor.

The improved performance of the isolated P-channel transistor increases the drive current and the ability to turn the CMOS transistor on more rapidly. The improved stacked CMOS transistor may be incorporated into an SRAM cell to obtain improved switching performance and charge stability within the cell. Thus it is apparent that there has been provided, in accordance with the invention, a stacked CMOS transistor structure and a method for its fabrication which fully meet the objects and advantages set forth above. Although the process has been described and illustrated with reference to specific illustrative embodiments thereof, it is not intended that the invention be limited to those illustrative embodiments. For example, the conductivity of the bulk and isolated transistors may be reversed where the P-channel transistor is formed in the silicon substrate and the N-channel transistor is isolated. Those skilled in the art will recognize that variations and modifications can be made without departing from the spirit of the invention. It is therefore intended to include within the invention all such variations and modifications as fall within the scope of the appended claims.

I claim:

1. A process for fabricating a shared-gate stacked, CMOS transistor structure comprising the steps of:
    providing a silicon substrate having an active region;
    forming a dielectric layer to overlie said active region;
    forming a first conductive layer of a first conductivity type to overlie said dielectric layer;
    forming a barrier layer to overlie said first conductive layer;
    forming a second conductive layer of a second conductivity type to overlie said barrier layer;
    forming an etch mask to overlie said second conductive layer;
    anisotropically etching said second conductive layer, said barrier layer, and said first conductive layer to form a self-aligned shared gate, said gate being located in said active region;
    forming an impurity region of a first conductivity type in said active region of said substrate using said etch mask as a dopant mask;
    removing said etch mask;
    forming an insulation layer to overlie said shared gate and said active region;
    forming a third conductive layer of a second conductivity type to overlie said insulation layer;
    forming a mask to overlie said third conductive layer said mask being located over a central portion of said shared gate;
    doping said third conductive layer with a dopant of a second conductivity type using said mask as a dopant mask; and
    removing said mask.

2. The process of claim 1 wherein said first conductivity type is N-type and said second conductivity type is P-type.

3. The process of claim 1 wherein said first conductivity type is P-type and said second conductivity type is N-type.

4. The process of claim 2 wherein said step of forming a first conductive layer comprises forming a refractory metal silicide, said silicide is selected from the group consisting of titanium silicide, tungsten silicide, molybdenum silicide, tantalum silicide, and cobalt silicide.

5. The process of claim 4 wherein said step of forming a second conductive layer comprises the steps of:
    depositing a layer of polysilicon; and
    doping said layer of polysilicon with an acceptor atom.

6. The process of claim 3 wherein said step of forming a second conductive layer comprises forming a refractory metal silicide, said silicide is selected from the group consisting of titanium silicide, tungsten silicide, molybdenum silicide, tantalum silicide, and cobalt silicide.

7. The process of claim 6 wherein said step of forming a first conductive layer comprises the steps of:
    depositing a layer of polysilicon; and
    doping said layer of polysilicon with an acceptor atom.

8. The process of claim 2 wherein said step of forming a first conductive layer and said step of forming a barrier layer comprise the steps of:
    depositing a layer of polysilicon to overlie said dielectric layer;
    depositing a layer of titanium to overlie said polysilicon layer; and
    annealing said polysilicon layer and said titanium layer in a nitrogen atmosphere at about 650 to 700 degrees centigrade to form a layer of titanium silicide and a layer of titanium nitride overlying said layer of titanium silicide.

9. The process of claim 8 wherein said step of forming a second conductive layer comprises the steps of:
    depositing a layer of polysilicon; and
    doping said layer of polysilicon with an acceptor atom.

10. A method for fabricating a semiconductor device comprising the steps of:
    forming a dielectric layer to overlie a surface of a P-type silicon substrate;
    depositing a first polysilicon layer to overlie said dielectric layer and doping said polysilicon layer with phosphorus;
    depositing a barrier layer by chemical vapor deposition to overlie said first polysilicon layer;

depositing a second polysilicon layer to overlie said barrier layer;

doping said second polysilicon layer with boron;

forming photoresist mask to overlie said second polysilicon layer;

anisotropically etching said second polysilicon layer, said barrier layer, and said first polysilicon layer to form a self-aligned shared gate;

removing said photoresist mask;

forming an N-type impurity region in said active region of said substrate by ion implantation using said shared gate as an ion implant mask;

thermally oxidizing said substrate to form a layer of silicon dioxide overlying said shared gate and said surface of said substrate;

depositing a third polysilicon layer to overlie said insulation layer;

doping said third polysilicon layer with boron;

forming a photoresist mask to overlie said third polysilicon layer, said mask being located over a central portion of said shared gate;

ion implanting said third polysilicon layer with boron using said photoresist mask as a dopant mask; and removing said mask.

11. The method of claim 10 wherein said barrier layer comprises the chemical vapor deposition of a refractory metal nitride selected from the group consisting of titanium nitride, tantalum nitride, and chromium nitride.

* * * * *